United States Patent
Fukuda et al.

(10) Patent No.: US 7,083,684 B2
(45) Date of Patent: Aug. 1, 2006

(54) METHOD OF REMOVING SEALANT USED FOR THE PROTECTION OF ELECTRIC OR ELECTRONIC PART

(75) Inventors: Kenichi Fukuda, Gunma-ken (JP); Mikio Shiono, Gunma-ken (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 39 days.

(21) Appl. No.: 10/834,262

(22) Filed: Apr. 29, 2004

(65) Prior Publication Data

US 2004/0220361 A1    Nov. 4, 2004

(30) Foreign Application Priority Data

May 1, 2003    (JP) .............................. 2003-126341

(51) Int. Cl.
*B08B 3/00* (2006.01)
(52) U.S. Cl. ................. 134/42; 134/2; 134/40
(58) Field of Classification Search .............. 134/2, 134/40, 42
See application file for complete search history.

(56) References Cited

U.S. PATENT DOCUMENTS

| 4,089,704 A | * | 5/1978 | Heiss et al. ................. 134/29 |
| 5,747,624 A | * | 5/1998 | Rubinsztajn et al. ......... 528/21 |
| 5,965,240 A | * | 10/1999 | Blackburn et al. .......... 428/192 |
| 6,652,665 B1 | * | 11/2003 | Sachdev et al. .............. 134/26 |
| 2002/0000239 A1 | * | 1/2002 | Sachdev et al. .............. 134/2 |

FOREIGN PATENT DOCUMENTS

| JP | 2001-72772 A | 3/1999 |
| JP | 11-116685 A | 4/1999 |
| JP | 11-181288 A | 7/1999 |

\* cited by examiner

*Primary Examiner*—Sharidan Carrillo
(74) *Attorney, Agent, or Firm*—Birch, Stewart, Kolasch & Birch, LLP

(57) ABSTRACT

A sealant used for the protection of an electric or electronic part is removed by contacting the sealant with tetramethylammonium hydroxide, tetrabutylammonium fluoride or the like for thereby dissolving the sealant. The method is capable of removing only the protective sealant from the electric or electronic part without causing damage to other components of the part.

12 Claims, 1 Drawing Sheet

METHOD OF REMOVING SEALANT USED FOR THE PROTECTION OF ELECTRIC OR ELECTRONIC PART

This Non-provisional application claims priority under 35 U.S.C. § 119(a) on patent application Ser. Nos. 2003-126341 filed in Japan on May 1, 2003, the entire contents of which are hereby incorporated by reference.

TECHNICAL FIELD

This invention relates to a method of removing a sealant used for the protection of an electric or electronic part, and more particularly, to a method of removing only the sealant while preventing other components of the part from being damaged.

BACKGROUND ART

In the prior art, electric and electronic parts, typically semiconductor devices such as diodes, transistors, ICs and LSIs are protected with sealants, for example, silicone, fluorosilicone and fluoroelastomer gels as disclosed in JP-A 11-116685, JP-A 11-181288 and JP-A 2001-72772.

It is sometimes necessary to inspect electric or electronic parts after the application of sealants. In the event a malfunction is found in commercial equipment on the market, it is necessary to recover equipment and analyze the cause of malfunction. In such events, only the sealant must be removed before the internal electric or electronic part can be inspected.

Typical means of dissolving silicone, fluorosilicone and fluoroelastomer gels make use of strong acids such as sulfuric acid, nitric acid, fuming sulfuric acid, trifluoroacetic acid, and hydrofluoric acid, strong bases such as sodium hydroxide and potassium hydroxide, and amines such as butylamine.

However, electronic parts are susceptible to corrosion or dissolution upon exposure to these chemicals because they are constructed of semiconductor silicon, metals such as aluminum, glass, and resins such as epoxy resins, polybutylene terephthalate (PBT) and polyphenylene sulfide (PPS). For this reason, it is undesirable or difficult to use these chemicals in the intended application.

SUMMARY OF THE INVENTION

An object of the invention is to provide a method of removing only a sealant from an electric or electronic part without causing damage to other components of the part.

The inventor has found a specific compound which is effective for removing a sealant used for the protection of an electric or electronic part.

According to the present invention, a sealant used for the protection of an electric or electronic part is removed by dissolving the sealant with a compound having the general formula (1):

    (1)

wherein $R^1$, $R^2$, $R^3$ and $R^4$ are each independently a substituted or unsubstituted monovalent hydrocarbon radical, and X is OH, F, Cl or Br.

DESCRIPTION OF THE PREFERRED EMBODIMENTS

Figure 1:
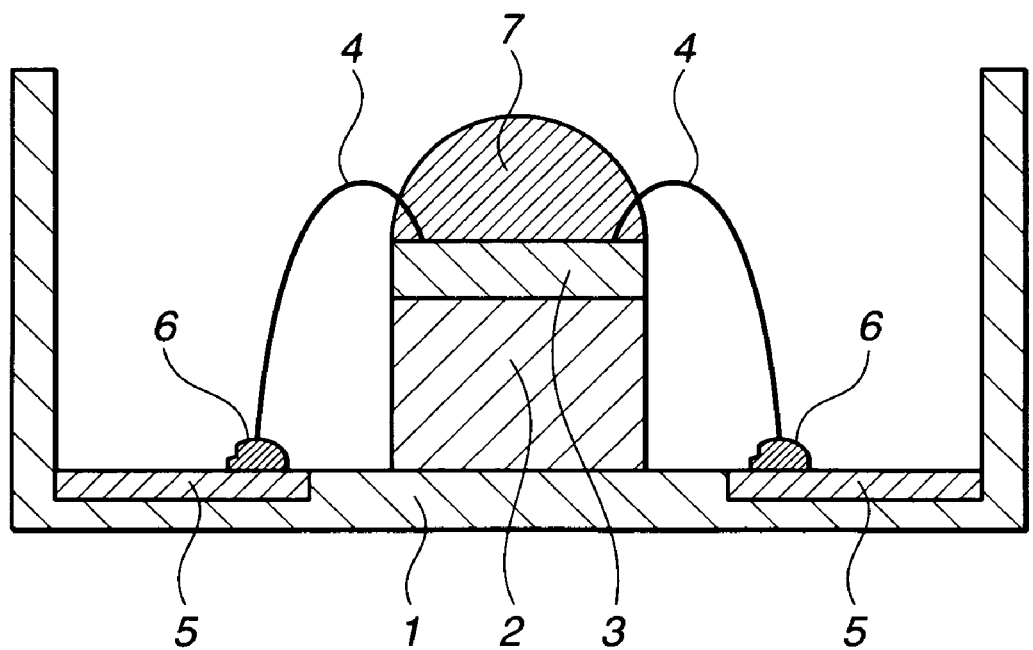
FIG. 1 is a schematic cross-sectional view of an electronic part to which the inventive method is applied.

The sealant removing method of the invention uses compounds having the general formula (1):

    (1)

wherein $R^1$, $R^2$, $R^3$ and $R^4$ are each independently a substituted or unsubstituted monovalent hydrocarbon radical, and X is OH, F, Cl or Br.

More particularly, each of $R^1$, $R^2$, $R^3$ and $R^4$ is independently a substituted or unsubstituted monovalent hydrocarbon radical, preferably having 1 to 12 carbon atoms, more preferably 1 to 6 carbon atoms. Examples include alkyl radicals such as methyl, ethyl, propyl, butyl, pentyl, hexyl, octyl and decyl; cycloalkyl radicals such as cyclohexyl and cycloheptyl; alkenyl radicals such as vinyl, allyl, propenyl, isopropenyl, butenyl and hexenyl; aryl radicals such as phenyl and tolyl; aralkyl radicals such as benzyl and phenylethyl; and substituted forms of the foregoing in which some or all of the hydrogen atoms are substituted with halogen atoms such as fluorine. Of these, alkyl radicals are preferred, with alkyl radicals having 1 to 6 carbon atoms being most preferred. X is OH, F, Cl or Br, and especially OH or F.

Examples of the compounds having formula (1) include tetramethylammonium hydroxide, tetraethylammonium hydroxide, tetrabutylammonium fluoride, tetramethylammonium chloride, tetraethylammonium chloride, and tetraethylammonium bromide. Inter alia, tetramethylammonium hydroxide and tetrabutylammonium fluoride are preferred. The compounds may be used alone or in admixture of two or more.

Most often the compound is used in the form of a dissolving liquid having the compound dissolved in a solvent. The solvent is not particularly limited as long as the compound is soluble therein. Suitable solvents include alcohols such as methanol, ethanol and propanol, ketones such as acetone and methyl ethyl ketone, ethers such as tetrahydrofuran, N,N-dimethylformamide, dimethyl sulfoxide, hexafluoro-m-xylene, and perfluoroether. The solvents may be used alone or in admixture.

In the dissolving liquid, the concentration of the compound of formula (1) may be below the saturated solubility, preferably in a range of 0.2 to 4.0 mol/L.

The method of removing a sealant according to the invention may be carried out in any desired way as long as the sealant is dissolved with the compound of formula (1). It suffices that the compound contacts the sealant with which an electric or electronic part is protected. For example, the sealant is immersed in the dissolving liquid. Alternatively, the dissolving liquid is sprayed to the sealant.

The contact time of the compound of formula (1) with the sealant may be determined as appropriate in accordance with the type and amount of the sealant, the dissolving temperature and the like. The contact time is usually about 10 minutes to several days, and preferably about 30 minutes to about 4 hours for working efficiency. The dissolution rate can be adjusted by heating. For safety, the heating temperature is preferably below the boiling point of the solvent used. The temperature may vary from room temperature to the boiling point of the solvent, and is usually about 25° C. to about 100° C.

Prior to dissolution with the compound of formula (1), the sealant is preferably swollen so that the compound may effectively penetrate into the sealant for facilitating dissolution. The solvent with which the sealant is swollen may be selected from the same solvents as used in the aforementioned dissolving liquid, with combinations of hexafluoro-m-xylene with alcohols or ethers being preferred.

Swelling is effected simply by contacting the swelling solvent with the sealant. Thus the sealant can be swollen by the same way as the application of the dissolving liquid. The temperature of the solvent for swelling the sealant varies with the type of solvent used. The swelling conditions which are selected as appropriate in accordance with the type of solvent may vary from 15 minutes at 100° C. to several days at 25° C., and is usually about 7 days at 25° C. to about 15 minutes at 100° C.

After removal of the sealant, the exposed electric or electronic part is preferably washed with an organic solvent such as hexafluoro-m-xylene or tetrahydrofuran for removing the residual reagent and cleaning dissolved matter.

The electric and electronic parts to which the inventive method is applicable include semiconductor devices such as diodes, transistors, ICs and LSIs.

The sealant or encapsulant is not particularly limited as long as it is used in the encapsulation or protection of electric and electronic parts. The invention is effective to sealants in gel form of silicone, fluorosilicone and fluoroelastomer. Of the fluoroelastomers, a fluoroelastomer gel having a perfluoropolyether structure in the backbone is preferred.

A typical fluoroelastomer gel is a curable composition comprising (A) a linear perfluoro compound containing at least two alkenyl radicals per molecule and having a perfluoro structure in the backbone, optionally (B) a linear perfluoro compound containing one alkenyl radical per molecule and having a perfluoro structure in the backbone, (C) an organosilicon compound having at least two hydrosilyl radicals per molecule, and (D) a platinum group metal catalyst, in the cured state.

The preferred perfluoropolyether structures are represented by the following general formulae.

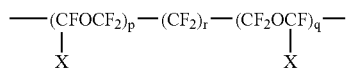

Herein X is F or a $CF_3$ radical, p, q and r are integers in the range: $p \geq 1$, $q \geq 1$, $2 \leq p+q \leq 200$, especially $2 \leq p+q \leq 110$, and $0 \leq r \leq 6$.

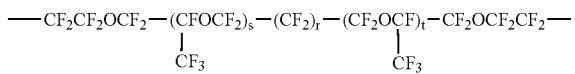

Herein r, s and t are integers in the range: $0 \leq r \leq 6$, $s \geq 0$, $t \geq 0$, and $0s+t \leq 200$, especially $2 \leq s+t \leq 110$.

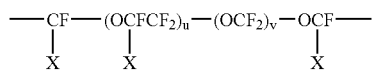

Herein X is F or a $CF_3$ radical, u and v are integers in the range: $1 \leq u \leq 20$ and $1 \leq v \leq 20$.

—$CF_2CF_2$—$(OCF_2CF_2CF_2)_w$—$OCF_2CF_2$—

Herein w is an integer of $1 \leq w \leq 100$.

Illustrative examples of fluoroelastomer gel include cured products of the curable compositions described in JP-A 11-116685, JP-A 11-181288 and JP-A 2001-72772. They are commercially available, for example, under the trade name SIFEL 8070 from Shin-Etsu Chemical Co., Ltd., which is cured into a gel form.

Also, silicone gels are commercially available, for example, under the trade name KE1052 from Shin-Etsu Chemical Co., Ltd. Fluorosilicone gels are commercially available, for example, under the trade name FE53 from Shin-Etsu Chemical Co., Ltd.

EXAMPLE

Examples of the invention are given below by way of illustration and not by way of limitation.

Example 1

An electronic part as shown in the cross-sectional view of FIG. 1 was used. In FIG. 1, a glass pedestal 2 having a silicon semiconductor device 3 rested thereon is disposed within a polybutylene terephthalate (PBT) package 1. The semiconductor device 3 is connected to nickel-plated insert pins 5 via aluminum bonding wires 4 and solder pads 6. The top of the semiconductor device 3 is encapsulated with a sealant 7 in the form of a fluoroelastomer gel SIFEL 8070 from Shin-Etsu Chemical Co., Ltd.

The electronic part was immersed in hexafluoro-m-xylene, which was heated at 60° C. for one hour. The electronic part was taken out, then immersed in a tetrahydrofuran/hexafluoro-m-xylene (1/1 by volume) solution of 1 mol/L tetrabutylammonium fluoride, which was heated at 60° C. for 30 minutes. The electronic part was taken out, washed with hexafluoro-m-xylene and tetrahydrofuran, and dried.

Through the above procedure, only the fluoroelastomer gel as the sealant was removed while the components of the electronic part remained intact and ensured electrical normal operation.

Example 2

The procedure of Example 1 was repeated except that a ethanol/hexafluoro-m-xylene (1/2 by volume) solution of 1 mol/L tetramethylammonium hydroxide was used as the dissolving liquid.

Only the fluoroelastomer gel as the sealant was removed while the components of the electronic part remained intact and ensured electrical normal operation.

Comparative Example 1

The electronic part used in Example 1 was immersed in conc. sulfuric acid, which was heated at 60° C. for one hour. The electronic part was taken out and washed with water. Its outer appearance was observed, finding that the fluoroelastomer gel had been dissolved away. However, dissolution took place on the package and aluminum bonding wires. Due to breakage of the bonding wires, the electronic part did not operate.

Comparative Example 2

The electronic part used in Example 1 was immersed in a 20 wt % hydrofluoric acid solution at 25° C. for one hour. The electronic part was taken out and washed with water. Its outer appearance was observed, finding that the fluoroelastomer gel had been dissolved away. However, the glass pedestal was completely dissolved and aluminum bonding wires were dissolved to some extent. The electronic part did not operate since the bonding wires were disconnected from the solder pads due to the stresses applied as a result of loss of the pedestal.

The method of the invention is capable of removing only a protective sealant from an electric or electronic part without causing damage to other components of the part.

Japanese Patent Application No. 2003-126341 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method of removing a fluoroelastomer gel sealant used for the protection of an electric or electronic part, comprising the step of:

dissolving the sealant so as to remove the sealant with a compound having the general formula (1):

$$[R^1R^2R^3R^4N]^+ \cdot X^- \quad (1)$$

wherein $R^1$, $R^2$, $R^3$ and $R^4$ are each independently a substituted or unsubstituted monovalent hydrocarbon radical, and X is F, Cl or Br, wherein the compound is used in the form of a dissolving liquid having the compound dissolved in a solvent.

2. The method of claim 1, wherein the concentration of the compound of formula (1) is in a range of 0.2 to 4.0 mol/L in the dissolving liquid.

3. The method of claim 1, wherein the sealant is dissolved with the compound of formula (1) by contacting the sealant to the compound of formula (1) for about 10 minutes to several days at room temperature to the boiling point of the solvent.

4. The method of claim 1, wherein prior to dissolution with the compound of formula (1), the sealant is swollen by contacting the sealant with hexafluoro-m-xylene or a combination of hexafluoro-m-xylene with an alcohol or ether as a swelling solvent.

5. The method of claim 1, wherein the fluoroelastomer gel is a curable composition comprising (A) a linear perfluoro compound containing at least two alkenyl radicals per molecule and having a perfluoro structure in the backbone, optionally (B) a linear perfluoro compound containing one alkenyl radical per molecule and having a perfluoro structure in the backbone, (C) an organosilicon compound having at least two hydrosilyl radicals per molecule, and (D) a platinum group metal catalyst, in the cured state.

6. The method of claim 4, wherein the swelling condition for contacting the swelling solvent with the sealant is from 15 minutes at 100° C. to several days at 25° C.

7. A method of removing a fluoroelastomer gel sealant used for the protection of an electric or electronic part, comprising the step of:

dissolving the sealant so as to remove the sealant with a compound having the general formula (1):

$$[R^1R^2R^3R^4N]^+ \cdot X^- \quad (1)$$

wherein $R^1$, $R^2$, $R^3$ and $R^4$ are each independently a substituted or unsubstituted monovalent hydrocarbon radical, and X is OH, wherein the compound is used in the form of a dissolving liquid having the compound dissolved in a solvent composed mainly of hexafluoro-m-xylene.

8. The method of claim 7, wherein the concentration of the compound of formula (1) is in a range of 0.2 to 4.0 mol/L in the dissolving liquid.

9. The method of claim 7, wherein the sealant is dissolved with the compound of formula (1) by contacting the sealant to the compound of formula (1) for about 10 minutes to several days at room temperature to the boiling point of the solvent.

10. The method of claim 7, wherein prior to dissolution with the compound of formula (1), the sealant is swollen by contacting the sealant with hexafluoro-m-xylene or a combination of hexafluoro-m-xylene with an alcohol or ether as a swelling solvent.

11. The method of claim 7, wherein the fluoroelastomer gel is a curable composition comprising (A) a linear perfluoro compound containing at least two alkenyl radicals per molecule and having a perfluoro structure in the backbone, optionally (B) a linear perfluoro compound containing one alkenyl radical per molecule and having a perfluoro structure in the backbone, (C) an organosilicon compound having at least two hydrosilyl radicals per molecule, and (D) a platinum group metal catalyst, in the cured state.

12. The method of claim 10, wherein the swelling condition for contacting the swelling solvent with the sealant is from 15 minutes at 100° C. to several days at 25° C.

* * * * *